(12) United States Patent
Hinnrichs

(10) Patent No.: US 11,079,281 B2
(45) Date of Patent: Aug. 3, 2021

(54) COLD STAGE ACTUATION OF OPTICAL ELEMENTS INCLUDING AN OPTICAL LIGHT SHIELD AND A LENSLET ARRAY CONNECTED TO A COLD FINGER

(71) Applicant: UVIA GROUP LLC, Humacao, PR (US)

(72) Inventor: Michele Hinnrichs, Humacao, PR (US)

(73) Assignee: UVIA GROUP LLC, Humacao, PR (US)

( * ) Notice: Subject to any disclaimer, the term of this patent is extended or adjusted under 35 U.S.C. 154(b) by 86 days.

(21) Appl. No.: 16/250,913

(22) Filed: Jan. 17, 2019

(65) Prior Publication Data

US 2020/0232851 A1    Jul. 23, 2020

(51) Int. Cl.
*G01J 3/02* (2006.01)
*G01J 3/18* (2006.01)
*G01J 3/28* (2006.01)
*G01J 5/06* (2006.01)
*G01J 5/08* (2006.01)
(Continued)

(52) U.S. Cl.
CPC .............. *G01J 5/061* (2013.01); *G01J 3/02* (2013.01); *G01J 3/021* (2013.01); *G01J 3/0202* (2013.01); *G01J 3/0205* (2013.01); *G01J 3/0208* (2013.01); *G01J 3/0216* (2013.01); *G01J 3/0237* (2013.01); *G01J 3/0286* (2013.01); *G01J 3/18* (2013.01); *G01J 3/2803* (2013.01); *G01J 3/2823* (2013.01); *G01J 5/06* (2013.01); *G01J 5/08* (2013.01); *G01J 5/084* (2013.01); *G01J 5/0806* (2013.01); *G01J 5/10* (2013.01); *G01J 5/601* (2013.01); *H01L 31/024* (2013.01); *G01J 2005/0077* (2013.01)

(58) Field of Classification Search
CPC .......... G01J 3/02; G01J 3/0202; G01J 3/0205; G01J 3/0208; G01J 3/021; G01J 3/0216; G01J 3/0237; G01J 3/0286; G01J 3/18; G01J 3/2803; G01J 3/2823; G01J 5/06; G01J 5/061; G01J 5/08; G01J 5/0806; G01J 5/084; G01J 5/10; G01J 5/601; G01J 2005/0077; H01L 31/024
USPC ........ 250/338.1, 338.4, 339.11, 339.14, 352, 250/339.03
See application file for complete search history.

(56) References Cited

U.S. PATENT DOCUMENTS 4,194,119 A * 3/1980 Mackenzie ........... F17C 13/006
165/185
4,918,312 A * 4/1990 Wellman ................ F17C 3/085
250/352

(Continued)

*Primary Examiner* — Allen C. Ho
(74) *Attorney, Agent, or Firm* — Felix L. Fischer

(57) ABSTRACT

A cold stage actuation system employs an optical assembly having an adapter ring mounted to a flange connected to a cold finger which extends into a Dewar housing. The flange supports a detector array. A resilient cold shield extends from the adapter ring to a lens holder, the lens holder connected to the resilient cold shield distal from the adapter ring. The lens holder supports a lenslet array. An optical light shield extends from the lens holder oppositely from the resilient cold shield to proximate a window in the Dewar housing. A motor is supported within the Dewar housing. An insulating translation arm connects the motor to the optical light shield, whereby operation of the motor induces the insulating translation arm to extend or retract the optical assembly concentric with an optical axis.

12 Claims, 5 Drawing Sheets

(51) Int. Cl.
*G01J 5/10* (2006.01)
*G01J 5/60* (2006.01)
*H01L 31/024* (2014.01)
*G01J 5/00* (2006.01)

(56) References Cited

U.S. PATENT DOCUMENTS

| | | | | |
|---|---|---|---|---|
| 4,954,708 A | * | 9/1990 | Salzer | F25D 19/006 250/352 |
| 4,996,427 A | * | 2/1991 | Noble | G01J 3/2823 250/332 |
| 5,103,097 A | * | 4/1992 | Montanari | G01J 5/061 250/352 |
| 5,111,050 A | * | 5/1992 | Maassen | F25D 19/006 250/352 |
| 5,179,283 A | * | 1/1993 | Cockrum | F25D 19/006 250/349 |
| 5,260,575 A | * | 11/1993 | Iwasaki | G01J 5/061 250/352 |
| 5,371,369 A | * | 12/1994 | Kent | G01J 5/061 250/332 |
| 5,408,100 A | * | 4/1995 | Gallivan | G01J 5/061 250/332 |
| 5,548,963 A | * | 8/1996 | Skertic | F25B 9/02 244/3.16 |
| 5,552,608 A | * | 9/1996 | Gallagher | F17C 3/085 250/352 |
| 5,561,294 A | * | 10/1996 | Iddan | G01J 5/02 250/330 |
| 5,598,966 A | * | 2/1997 | Romano | B23K 1/19 228/124.6 |
| 5,619,039 A | * | 4/1997 | Montanari | F25D 19/006 250/352 |
| 5,628,196 A | * | 5/1997 | Farmer | F25D 19/006 372/36 |
| 5,834,778 A | * | 11/1998 | Veyrier | G01J 5/061 250/352 |
| 5,966,945 A | * | 10/1999 | Mengel | G01J 5/061 250/352 |
| 6,070,414 A | * | 6/2000 | Ross | G01J 5/061 62/51.1 |
| 6,122,919 A | * | 9/2000 | Patel | G01J 5/061 250/352 |
| 6,144,031 A | * | 11/2000 | Herring | G01J 5/04 250/252.1 |
| 6,169,775 B1 | * | 1/2001 | Takahashi | G01J 5/061 250/352 |
| 6,417,514 B1 | * | 7/2002 | Eneim | H01L 27/14636 250/352 |
| 6,675,600 B1 | * | 1/2004 | Robillard | G01J 5/061 62/259.2 |
| 7,105,821 B1 | * | 9/2006 | Kennedy | G01J 5/20 250/339.07 |
| 7,253,396 B2 | * | 8/2007 | Loiseau | F25D 19/006 250/238 |
| 7,415,830 B2 | * | 8/2008 | Wyatt | G01J 5/061 62/6 |
| 7,500,367 B2 | * | 3/2009 | Ruocco-Angari | F25D 19/006 62/51.1 |
| 7,592,594 B2 | * | 9/2009 | Ginn | H01L 27/14618 250/332 |
| 7,724,412 B2 | * | 5/2010 | Powell | G01J 5/04 359/234 |
| 7,910,890 B2 | * | 3/2011 | Hinnrichs | G01J 5/0806 250/339.03 |
| 8,193,496 B2 | * | 6/2012 | Furry | G01N 33/0036 250/330 |
| 8,621,876 B2 | * | 1/2014 | Bin-Nun | G01J 5/061 439/2 |
| 8,637,824 B2 | * | 1/2014 | Mullins | G01J 5/061 250/352 |
| 8,659,664 B2 | * | 2/2014 | Benson | G01J 5/061 250/330 |
| 8,674,308 B2 | * | 3/2014 | Singer | G01J 5/04 250/352 |
| 8,736,836 B2 | * | 5/2014 | Chrisp | G01J 3/1809 356/328 |
| 8,749,636 B2 | * | 6/2014 | Brown | G01J 3/2823 250/338.1 |
| 8,941,067 B2 | * | 1/2015 | Erving | F28F 9/007 250/352 |
| 9,010,131 B2 | * | 4/2015 | Brunton | G01J 5/061 62/259.2 |
| 9,121,760 B2 | * | 9/2015 | Cabib | G01J 5/06 |
| 9,194,750 B2 | * | 11/2015 | Oster | G01J 5/0806 |
| 9,207,434 B2 | * | 12/2015 | Staver | G02B 13/146 |
| 9,234,693 B2 | * | 1/2016 | Toft | G01J 1/0271 |
| 9,291,506 B2 | * | 3/2016 | Cabib | G01J 5/06 |
| 9,366,574 B2 | * | 6/2016 | Pereverzev | G01J 3/021 |
| 9,464,939 B2 | * | 10/2016 | Cassaigne | H01L 31/02325 |
| 9,766,130 B2 | * | 9/2017 | Maimon | G01J 5/061 |
| 9,939,321 B2 | * | 4/2018 | Bartosewcz | B28B 21/42 |
| 10,064,265 B2 | * | 8/2018 | Robert | G01J 5/10 |
| 10,145,513 B2 | * | 12/2018 | Chuard | F17C 13/00 |
| 10,168,206 B2 | * | 1/2019 | Cassaigne | C22C 30/02 |
| 10,208,894 B1 | * | 2/2019 | Mitchell | F17C 3/085 |
| 10,222,266 B2 | * | 3/2019 | Veprik | H01L 31/032 |
| 10,393,588 B2 | * | 8/2019 | Cottereau | G01J 5/04 |
| 10,481,007 B2 | * | 11/2019 | Davenel | G01J 5/0862 |

\* cited by examiner

COLD STAGE ACTUATION OF OPTICAL ELEMENTS INCLUDING AN OPTICAL LIGHT SHIELD AND A LENSLET ARRAY CONNECTED TO A COLD FINGER

BACKGROUND

Field

This implementations in this disclosure relate generally to the field of diffractive lenslet optics for spectral imaging and more particularly to an actuation system actuating lenslet optical elements in a cold stage of a cryogenic cooling system.

Description of the Related Art

Spectral imaging may be accomplished using circular blazed grating diffractive lenslet arrays to discriminate various wavelengths as disclosed in U.S. Pat. No. 7,910,890 issue on Mar. 22, 2011 entitled and having a common assignee with the present invention, the disclosure of which is incorporated herein by reference. However, such spectral imaging systems typically need to be cooled for infrared wavelength detection. To accomplish necessary cooling the infrared detector needs to be placed inside a cryogenic dewar but the diffractive optical elements need to be placed very close to the detector array, within several millimeters.

It is therefore desirable to provide an actuation system for a spectral imaging lenslet system which allows close placement of the optical elements and detector.

SUMMARY

The implementations disclosed herein overcome the shortcomings of the prior art by providing a cold stage actuation system with an optical assembly having an adapter ring mounted to a flange connected to a cold finger which extends into a dewar. The flange supports a detector array. A resilient cold shield extends from the adapter ring to a lens holder, the lens holder connected to the resilient cold shield distal from the adapter ring. The lens holder supports a lenslet array. An optical light shield extends from the lens holder oppositely from the resilient cold shield to proximate a window in the dewar. A motor is supported within the dewar. An insulating translation arm connects the motor to the optical light shield, whereby operation of the motor induces the insulating translation arm to extend or retract the optical assembly concentric with an optical axis.

These and other features and advantages of the present invention will be better understood by reference to the following detailed description of exemplary implementations when considered in connection with the accompanying drawings.

DETAILED DESCRIPTION

Figure 1:
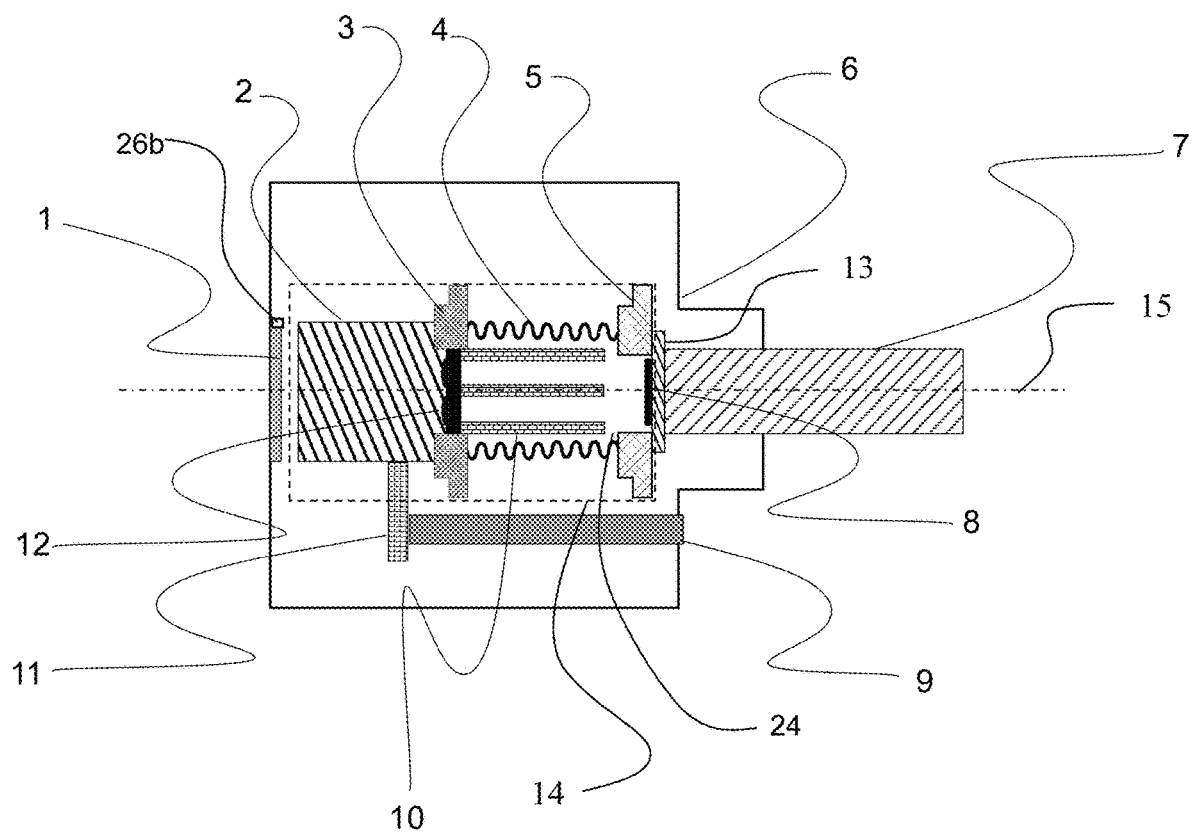
FIG. 1 is a schematic side view of a spectral radiation detector employing a first implementation of light baffles.

Implementations shown in the drawings and described herein provide the ability to mechanically actuate the optics inside a vacuum sealed enclosure and at the same time cool the optical elements including a lenslet array. Spectral performance is improved by cooling of the diffractive optical elements. The size of the overall configuration is small enough to fit in a small dewar that is cooled using a low power light weight cryogenic cooler such as a split sterling, rotary sterling, or similar device. An actuation motor is enclosed in miniature dewar system along with the detector array and diffractive optical array to translate the optical elements along an optical axis to perform spectral imaging and range focusing. Thermal insulation between the motor and the cooled optical elements and optical actuation system insure low thermal mass that needs to be cooled by the miniature cryogenic cooler Referring to the drawings, FIG. 1 shows an example spectral radiation detector having a Dewar housing 6 with a window 1. A cold-finger 7 is connected to a cryocooler (not shown) to cool a detector array 8 mounted to a flange 13 integral to or connected to the cold finger 7. An adapter ring 5 is mounted to the flange 13 to support an optical assembly 14. The flange 13 conducts heat from the detector array 8 and the optical assembly 14 through the adapter ring 5 to the cryocooler through the cold finger 7. The adapter ring 5 is made of a material with high thermal conduction and can easily be bonded to the flange 13 on which the focal plane array is mounted. Exemplary materials are copper, aluminum, gold, or highly conductive alloys. The adapter ring 5 may be bonded to the flange 13, however, the bonding materials must be compatible with a vacuum environment must not outgas, must be a good thermal conductor and, in this case, must function at cryogenic temperatures. For the example implementations titanium is used for the adapter ring 5.

A resilient cold shield 4 is connected to the adapter ring 5 and is unique from a standard cold-shield in that a corrugated wall allows the resilient cold shield 4 to resiliently extend and retract enabling the actuation of a lenslet array 12 along an optical axis 15 in order to focus the diffractive image from the lenslet array 12, as will be described subsequently. The resilient cold shield 4 conductively cools the lenslet array 12.

A lens holder 3 is attached to the resilient cold shield 4 distal from the adapter ring 5 and holds the lenslet array 12 in concentric alignment along the optical axis 15 inside the Dewar housing 6. The lens holder 3 is made of a material with high thermal conductivity, low reflectivity, and low emissivity to ensure that the lenslet array 12 can be cooled to a temperature that minimizes interference of unwanted background thermal energy from the lenslet array 12 or the window 1 with the thermal signal coming from the scene. The lens holder 3 is also coated or painted with a material that minimizes reflection and emission of thermal energy that may interfere with the thermal energy coming from the scene that is being imaged. The importance of cooling the lenslet array 12 is to keep the unwanted background thermal energy low so that the signal that reaches the detector array 8 is dominated by the scene of interest and not the temperature radiation from the lenslet array 12 and the window 1, thus increasing the signal to noise. The lens holder 3, as carried by the resilient cold shield 4, secures the lenslet array 12 in a position relative to the detector array 8 and keeps it in alignment so that the image is stable on the detector array 8 as the lenslet array 12 is translated along the optical axis 15.

Since the thermal path to the lenslet array 12 is through the resilient cold shield 4, the resilient cold shield 4 is made of material that has a high thermal conduction such as aluminum or cooper in order to cool the lens holder 3. It is plated with a material that is highly reflective and minimally absorptive on the outside; for an exemplary implementation, it is plated with gold. The purpose is to reflect heat and keep the resilient cold shield 4 from heating thus reducing the heat load to enable the cryocooler to cool the resilient cold shield 4 with as little as possible energy. The coating must not change the ability of the spring action at cryogenic temperatures. The inside is coated or painted with a black material that has low reflective and low emissive properties. The purpose is to keep any stray light (heat) from reflecting into the scene being focused by the lenslet array 12 and imaged by the detector array 8 (focal plane array). The material used in the prototype system is nickel.

An optical light shield 2 is integrated into the optical assembly 14 by attachment to lens holder 3 and extending from the lens holder 3 opposite the resilient cold shield 4 and terminating proximate the window 1 to minimize thermal radiation interfering with the infrared image that is being focused by the lenslet array 12. The optical light shield 2 is made of a material with high thermal conductivity (for an exemplary implementation aluminum). The outside of the optical light shield 2 is plated or coated with a material that is highly reflective and minimally absorptive. In an exemplary implementation gold plating is employed. The purpose is to reflect heat and keep the optical light shield 2 from heating in order to enable the cryocooler acting through the cold finger 7 to cool the optical assembly 14 including the optical light shield 2 with as little energy as possible and also to ensure that heat is not transmitted to the inside of the optical light shield 2 to potentially interfere with the infrared light from the scene viewed through the window 1. The inside of the optical light shield 2 is coated or painted with a black material that has low reflectivity and low emissivity properties. The purpose is to keep any stay light (heat) from reflecting into the light coming from the scene that will be focused by the lenslet array 12 and imaged by a detector array 8 (focal plane array).

A motor 9 is used to drive the optical assembly 14 along the optical axis 15 for spectral focus. In the implementation of FIG. 1, it is important that the motor 9 is small to fit in the Dewar housing 6 and uses very low power to ensure minimum heat released inside the dewar. Any heat inside the Dewar housing 6 can interfere (reflect, emit or be absorbed by components in the Dewar housing 6) with the scene that is being focused by the lenslet array 12 and imaged on the detector array 8. For an exemplary implementation a micro piezo motor is employed with very low power and has the ability to move the lenslet array 12 in micro steps on the order of microns.

An insulating translation arm 11 connects the motor 9 to the optical assembly 14 at the optical light shield 2. The insulating translation arm 11 is made of a material that has very low thermal conduction to ensure that the any heat from the motor 9 is not transferred to the cold components in the optical assembly 14. In exemplary implementations the materials include ceramic, glass or similar materials. The insulating translation arm 11 mechanically connects the motor 9 and the optical assembly 14 that is being translated along the optical axis 15. The material employed for the insulating translation arm 11 in an exemplary embodiment is a composite resin material made from a combination of phenol and aldehyde (Phenolic), which is a rigid material that is highly thermally insulating. Extension of the optical assembly 14 by operation of the motor 9 driving the insulating translation arm 11 toward the window 1 causes the resilient cold shield 4 to extend. Retraction of the optical assembly 14 by reverse operation of the motor 9 driving the insulating translation arm 11 toward the flange 13 causes the resilient cold shield 4 to contract. As previously described, the optical assembly 14 translates over a range from a fully retracted position to a fully extended position. In one exemplary configuration, the corrugated wall of the resilient cold shield 4 has an initial fully retracted position in which the corrugations are in a relaxed condition. Activation of the motor 9 to extend the optical assembly 14 along the optical axis 15 resiliently extends the corrugated wall through the range of motion from fully retracted to fully extended. Retraction of the optical assembly 14 is assisted by the resiliently extended corrugated wall and a positive bias is maintained on the motor 9 throughout the range of motion. In a second exemplary configuration, the corrugated wall of the resilient cold shield 4 is neither compressed nor decompressed in a neutral position in the range of travel and then actuation is performed by stretching or contracting the corrugated wall of the resilient cold shield 4.

Figure 4:
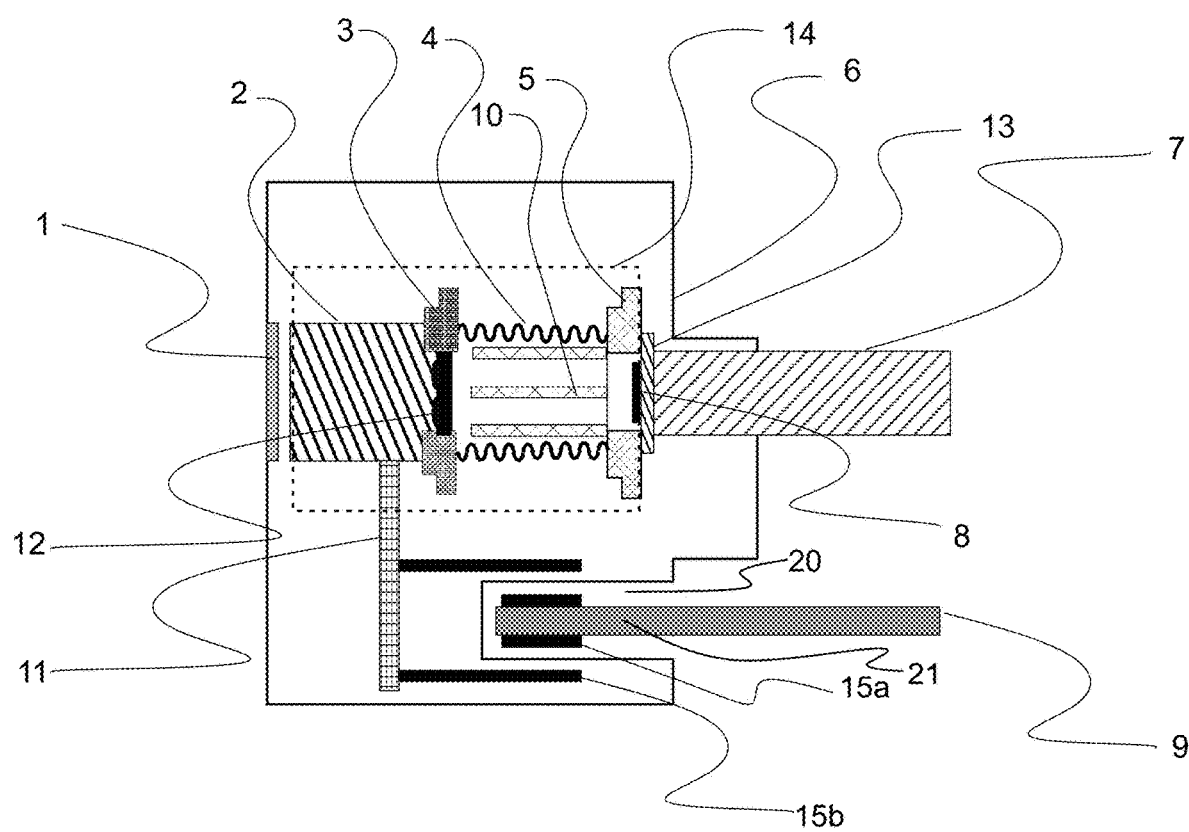
FIG. 4 is a schematic side view of the first implementation of the spectral radiation detector employing a first alternative motor engagement structure; and, FIG. 5 is schematic side view of the first implementation of the spectral radiation detector employing a first alternative motor engagement structure.

Heat leak created by the drive system for the optical assembly 14 is undesirable. A first alternative drive system arrangement is shown in FIG. 4. To reduce conductive heat paths from the motor 9, an external cavity 20 protrudes into the Dewar housing 6 and receives a drive rod 21 from the motor 9 which is axially translatable within the external cavity 20. A first magnetic element 15a is attached to the drive rod 21. A second magnetic element 15b arranged for magnetic coupling with the first magnetic element 15a is concentric to the external cavity 20 (and first magnetic element 15a) and is attached to the insulating translation arm 11. Translation of the first magnetic element 15a within the external cavity 20 is mirrored by translation of the second magnetic element 15b and the insulating translation arm 11 thereby extending or retracting the optical assembly 14 along the optical axis 15.

Figure 5:
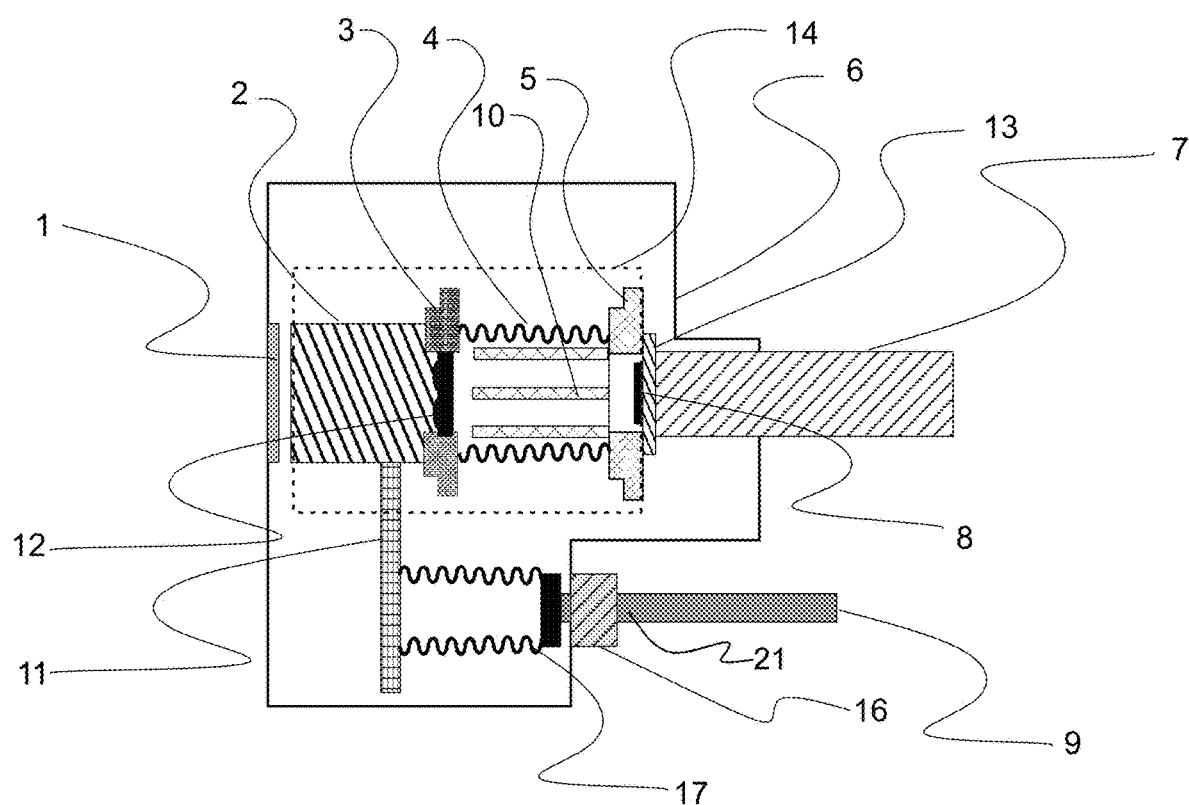

A second alternative motor arrangement for reducing heat leak is shown in FIG. 5. A vacuum seal 16 is provided in the Dewar housing 6 allowing drive rod 21 or other actuating mechanism to axially translate into the Dewar housing 6. Drive rod 21 is attached to a first end of a bellows spring 17 which is attached at a second end to the insulating translation arm 11. Translation of the drive rod 21 creates a compression or extension force in the bellows spring 17 that is transferred to the insulating translation arm 11 to extend or retract the optical assembly 14 including the resilient cold shield 4. While shown as providing a direct corresponding translation between extension and contraction of the bellows spring 17 with extension and contraction of the optical assembly 14, a hinged pivot engaging the insulating translation arm 11 intermediate the bellows spring 17 and the optical light shield 2 is alternately employed for counter-action between the bellows spring 17 and optical assembly 14 whereby compression force of the bellows spring 17 results in extension of the optical assembly 14 and extension force on the bellows spring 17 results in contraction of the optical assembly 14.

Figure 2:
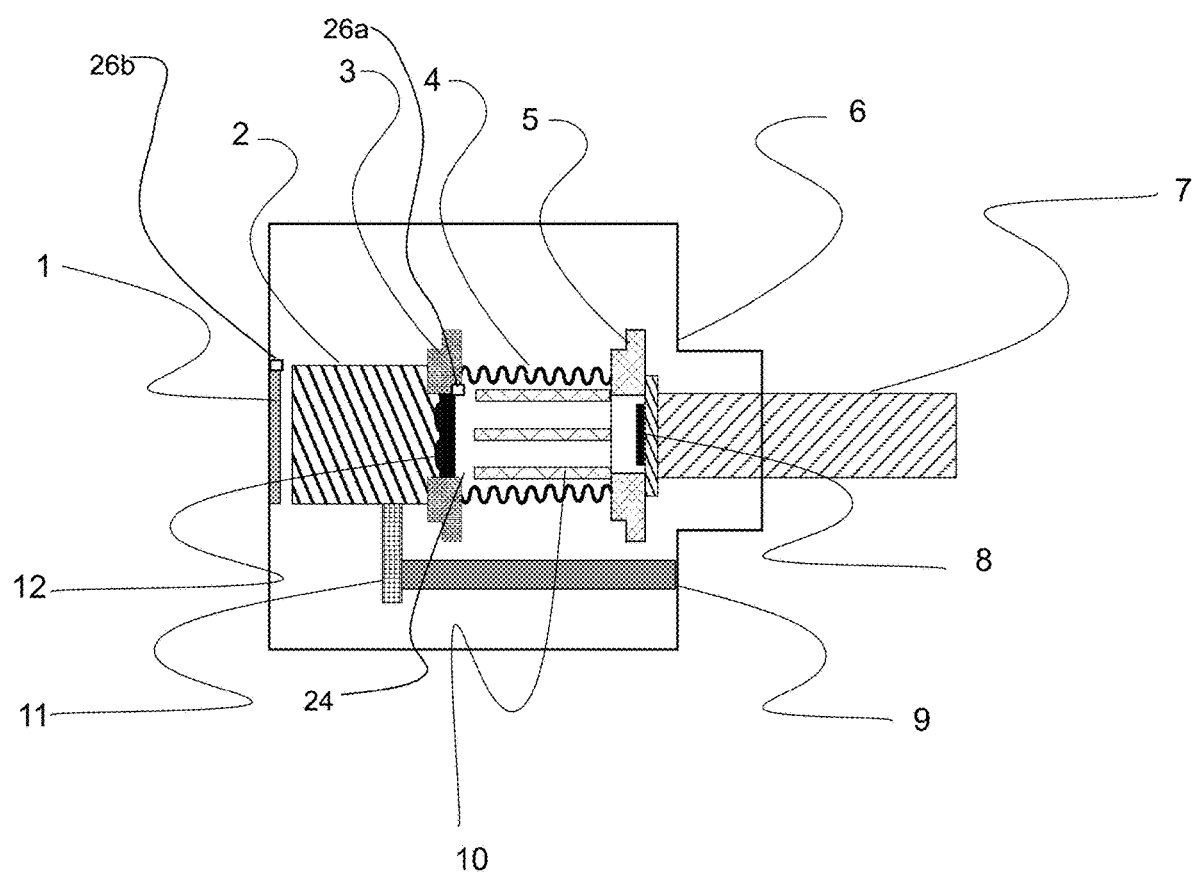
FIG. 2 is a schematic side view of a spectral radiation detector employing a second implementation of light baffles.

Light baffles 10 are used to ensure that the scene that is being imaged by the different lenslets in the lenslet array 12 and focused on the detector array 8 are shielded from one another to reduce optical crosstalk. It is important that the light baffles 10 are made of a material with high thermal conduction in order to allow cooling by conductive contact with the structure of the optical assembly 14 so that they do not radiate unwanted thermal signal (background) and interfere with the infrared image that is being focused by the lenslets in the lenslet array 12 and imaged by the detector array 8. The light baffles 10 may be attached to the lens holder 3 as shown in FIG. 1 or to the adapter ring 5 as shown in FIG. 2. The length of the light baffles 10 is critical and is as long as possible to ensure image isolation between the lenslets array 12 and the detector array 8 as the lenslet array 12 is translated along the optical axis 15. In either exemplary implementation, length of the light baffles 10 is determined to provide a gap 24 equal to the total range of traverse of the lens holder 3 relative to the adapter ring 5. A stopping mechanism such as a proximity sensor or feeler switch 26a may be employed to stop the motor 9 to prevent the light baffles 10 from hitting the detector array 8 with a similar feeler switch 26b to prevent the optical light shield 2 from contacting window 1.

Figure 3:
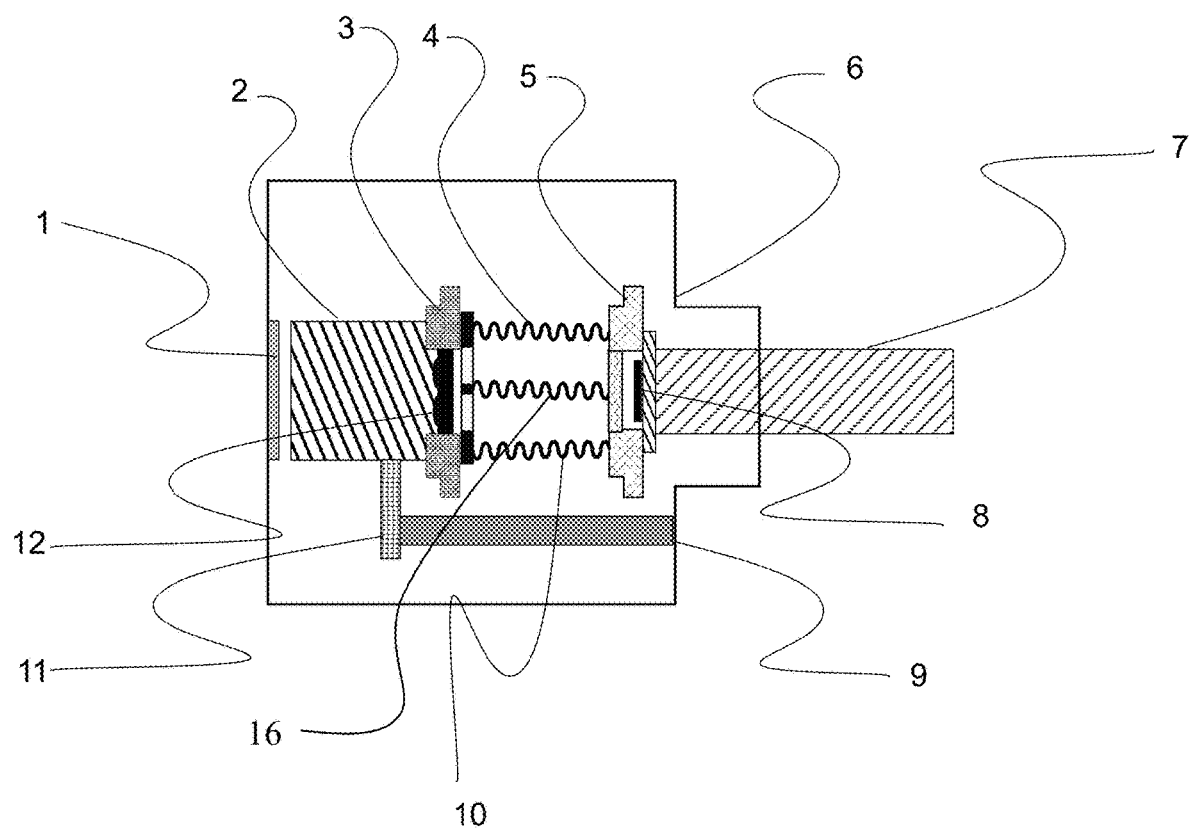
FIG. 3 is a schematic side view of a spectral radiation detector employing a third implementation of light baffles.

An alternative exemplary implementation, as shown in the FIG. 3, is to make light baffles 16 a resilient spring that attaches at both ends between the lenslet array 12 and the detector array 8 (to both the lens holder 3 and adapter ring 5). For this implementation the light baffles 16 are made of a material that is resiliently compressible and has high thermal conduction to enable operation at cold temperatures. In this case it might look much like the resilient cold-shield 4 and in fact may be one unit. It is equally important that the light baffles 16 be as thin as possible to ensure that they minimize blocking any portion of the image that is being focused on the detector array 8 by each lenslet in the lenslet array 12. For this implementation no gap 24 is required.

Having now described various implementations of the invention in detail as required by the patent statutes, those skilled in the art will recognize modifications and substitutions to the specific implementations disclosed herein. Such modifications are within the scope and intent of the present invention as defined in the following claims.

What is claimed is:

1. A cold stage actuation system comprising:
   a dewar;
   a cold finger extending into the dewar;
   an optical assembly having:
      a flange connected to the cold finger;
      a detector array supported in the flange;
      an adapter ring mounted to the flange;
      a lens holder;
      a lenslet array;
      a resilient cold shield extending from the adapter ring to the lens holder, the lens holder supported by the resilient cold shield, said resilient cold shield transmitting thermal energy to the cold finger;
      said lens holder connected to the resilient cold shield distal from the adapter ring, said lens holder supporting the lenslet array, wherein the resilient cold shield acts as a path to cool the lenslet array;
   a motor; and
   an insulating translation arm connected to the motor and connected to the optical assembly, whereby operation of the motor induces the insulating translation arm to extend or retract the optical assembly concentric with an optical axis.

2. The cold stage actuation system of claim 1, further comprising:
   a window in the dewar; and
   an optical light shield extending from the lens holder oppositely from the resilient cold shield to proximate the window, the optical light shield conductively cooled by the cold finger through the resilient cold shield, said insulating translation arm connected through the optical light shield to the lens holder.

3. The cold stage actuation system as defined in claim 1, further comprising:
   one or more light baffles extending intermediate the lens holder and the adapter ring, and conductively connected to the cold finger.

4. The cold stage actuation system as defined in claim 3, wherein the one or more light baffles are connected to the lens holder.

5. The cold stage actuation system as defined in claim 3, wherein the one or more light baffles are connected to the adapter ring.

6. The cold stage actuation system as defined in claim 3, wherein the one or more light baffles are resiliently corrugated and are connected to and extend between the lens holder and the adapter ring.

7. The cold stage actuation system as defined in claim 1, wherein the motor is supported within the dewar.

8. The cold stage actuation system as defined in claim 1, wherein the dewar comprises an external cavity, and the cold stage actuation system further comprises:
   a drive rod from the motor axially translatable within the external cavity;
   a first magnetic element attached to the drive rod; and
   a second magnetic element arranged for a magnetic coupling with the first magnetic element concentric to the external cavity and first magnetic element, and attached to the insulating translation arm, whereby a translation of the first magnetic element within the external cavity is mirrored by a translation of the second magnetic element and the insulating translation arm, thereby extending or retracting the optical assembly along the optical axis.

9. The cold stage actuation system as defined in claim 1, further comprising:
   a drive rod;
   a vacuum seal in the dewar receiving the drive rod to axially translate into the dewar; and
   a bellows spring attached at a first end to the drive rod and attached at a second end to the insulating translation arm, whereby a translation of the drive rod creates a compression or an extension force in the bellows spring that is transferred to the insulating translation arm to extend or retract the optical assembly.

10. The cold stage actuation system as defined in claim 1, wherein the resilient cold shield has a corrugated wall extending from the adapter ring to the lens holder.

11. The cold stage actuation system as defined in claim 10, wherein the corrugated wall of the resilient cold shield has an initial fully retracted position in which the corrugated wall is in a relaxed condition, and an activation of the motor to extend the optical assembly along the optical axis resiliently extends the corrugated wall through a range of motion from fully retracted to fully extended.

12. The cold stage actuation system as defined in claim 10, wherein the corrugated wall of the resilient cold shield is neither compressed or decompressed in a neutral position in a range of travel, and upon an actuation of the motor, a translation of the optical assembly is performed by stretching or contracting the corrugated wall of the resilient cold shield.

* * * * *